(12) United States Patent
Wang et al.

(10) Patent No.: US 11,874,349 B2
(45) Date of Patent: Jan. 16, 2024

(54) CROSS INDUCTOR/CAPACITOR TO SIMPLIFY MRI COIL ELEMENT DECOUPLING

(71) Applicant: Siemens Healthcare GmbH, Erlangen (DE)

(72) Inventors: JianMin Wang, Shenzhen (CN); Qiu Yi Zhang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/576,107

(22) Filed: Jan. 14, 2022

(65) Prior Publication Data
US 2022/0229129 A1 Jul. 21, 2022

(30) Foreign Application Priority Data

Jan. 18, 2021 (CN) .......................... 202110062772.8

(51) Int. Cl.
*G01R 33/36* (2006.01)
*G01R 33/44* (2006.01)

(52) U.S. Cl.
CPC ..... *G01R 33/3642* (2013.01); *G01R 33/3685* (2013.01); *G01R 33/44* (2013.01)

(58) Field of Classification Search
CPC .............. G01R 33/341; G01R 33/3415; G01R 33/3628; G01R 33/3635; G01R 33/3642; G01R 33/365; G01R 33/3657; G01R 33/3685
See application file for complete search history.

(56) References Cited

U.S. PATENT DOCUMENTS

| | | | | |
|---|---|---|---|---|
| 5,208,534 | A * | 5/1993 | Okamoto | G01R 33/3415 324/309 |
| 5,430,378 | A * | 7/1995 | Jones | G01R 33/3678 324/318 |
| 5,450,011 | A * | 9/1995 | Boeijen | G01R 33/3628 324/318 |
| 5,543,713 | A * | 8/1996 | Arakawa | G01R 33/3685 324/318 |

(Continued)

FOREIGN PATENT DOCUMENTS

CN 1941500 A 4/2007

OTHER PUBLICATIONS

P. B. Roemer et al: "The NMR Phased Array", Magnetic Resonance in Medicine 16, pp. 192-225, 1990.

*Primary Examiner* — Steven L Yeninas
(74) *Attorney, Agent, or Firm* — Banner & Witcoff Ltd.

(57) ABSTRACT

A coil unit decoupling device and a magnetic resonance system. The device comprises a first phase shift circuit, a second phase shift circuit and a first crossover element, and the first crossover element is a capacitor or inductor, wherein a first connecting end of the first phase shift circuit is connected with a first port of a first coil unit, a second connecting end of the first phase shift circuit is connected with a first connecting end of the first crossover element, a first connecting end of the second phase shift circuit is connected with a first port of a second coil unit, a second connecting end of the second phase shift circuit is connected with a second connecting end of the first crossover element, and the first coil unit and the second coil unit are located in a magnetic resonance system.

11 Claims, 19 Drawing Sheets

(56) References Cited

U.S. PATENT DOCUMENTS

| | | | |
|---|---|---|---|
| 5,708,361 A | 1/1998 | Wang et al. | |
| 6,351,124 B1* | 2/2002 | Vester | G01R 33/3621 |
| | | | 324/318 |
| 2006/0006870 A1 | 1/2006 | Wang et al. | |
| 2007/0085540 A1* | 4/2007 | Du | G01R 33/3628 |
| | | | 324/318 |
| 2009/0128154 A1* | 5/2009 | Chu | G01R 33/3614 |
| | | | 324/322 |
| 2013/0271143 A1* | 10/2013 | Vester | G01R 33/3628 |
| | | | 324/322 |
| 2013/0314091 A1* | 11/2013 | Otake | G01R 33/3657 |
| | | | 324/322 |
| 2016/0223629 A1* | 8/2016 | Biber | G01R 33/3685 |
| 2019/0257897 A1 | 8/2019 | Yang et al. | |
| 2019/0339344 A1* | 11/2019 | Miosga | G01R 33/365 |
| 2020/0096584 A1* | 3/2020 | Yang | G01R 33/3635 |

* cited by examiner

| # CROSS INDUCTOR/CAPACITOR TO SIMPLIFY MRI COIL ELEMENT DECOUPLING

TECHNICAL FIELD

The present disclosure relates to the technical field of magnetic resonance (MR) systems, in particular to a coil unit decoupling device and a magnetic resonance system.

BACKGROUND

In an MR system, especially a low-field MR system, coupling between coil units is very important. For a low-field MR system, because of the high Q-factors of coil units, coupling between coil units far away from each other must not be ignored, either.

In order to realize decoupling between coil units, a number of solutions have been proposed in the prior art. The most common decoupling method is to use overlapping to offset the magnetic fields in the positive and negative directions. If overlapping decoupling does not work, inductance decoupling or capacitance decoupling is used. Another method is to use a crossover capacitance to realize strong decoupling between up to 3~4 coil units. Recently, a method of using an end-ring for decoupling between coil units has also been proposed. Complex adjustments are required for all these decoupling methods during the manufacturing process. In addition, an additional signal-to-noise ratio (SNR) loss will be caused because the wire lengths of coil units and the inductance loss are increased in these decoupling methods.

FIG. 1 is a schematic diagram of four coil units distributed on a cylindrical surface, wherein overlapping decoupling can be realized between adjacent coil units, for example, between coil units 11 and 12, between coil units 11 and 14, between coil units 12 and 13, and between coil units 13 and 14, but it is difficult to realize decoupling between coil units 11 and 13 and between coil units 12 and 14 because the coil units 11 and 13 are not adjacent to each other and the coil units 12 and 14 are not adjacent to each other.

SUMMARY

In view of this, aspects of the present disclosure provide coil unit decoupling devices to lower the complexity in decoupling coil units in an MR system.

Aspects of the present disclosure further provide MR systems to lower the complexity in decoupling the coil units in the MR systems.

The technical solution of the aspects of the present disclosure is realized in this way:

A coil unit decoupling device comprises a first phase shift circuit, a second phase shift circuit and a first crossover element, and the first crossover element is a capacitor or inductor, wherein
 a first connecting end of the first phase shift circuit is connected with a first port of a first coil unit;
 a second connecting end of the first phase shift circuit is connected with a first connecting end of the first crossover element;
 a first connecting end of the second phase shift circuit is connected with a first port of a second coil unit;
 a second connecting end of the second phase shift circuit is connected with a second connecting end of the first crossover element;

the first phase shift circuit enables the first coil unit to be matched and enables the first coil unit to have a phase shift of 180° between a matched state and a non-matched state, the second phase shift circuit enables the second coil unit to be matched and enables the second coil unit to have a phase shift of 180° between a matched state and a non-matched state, the first coil unit and the second coil unit are located in a magnetic resonance system, the first port is any port on a self-contained loop of the first coil unit, and the second port is any port on a self-contained loop of the second coil unit.

The first phase shift circuit comprises a first capacitor and a first inductor group, and the first inductor group comprises one inductor or multiple inductors connected in series, wherein
 a first connecting end of the first capacitor is connected with the first port of the first coil unit and a first connecting end of the first inductor group, and a second connecting end of the first capacitor is grounded, wherein the first connecting end of the first inductor group is the connecting end of a first inductor in the first inductor group for an external connection, and a second connecting end of the first inductor group is the connecting end of a last inductor in the first inductor group for an external connection;
 and/or, the second phase shift circuit comprises a second capacitor and a second inductor group, wherein
 a first connecting end of the second capacitor is connected with the first port of the second coil unit and a first connecting end of the second inductor group, and a second connecting end of the second capacitor is grounded, wherein the first connecting end of the second inductor group is the connecting end of a first inductor in the second inductor group for an external connection, and a second connecting end of the second inductor group is the connecting end of a last inductor in the second inductor group for an external connection;
 the first connecting end of the first crossover element is connected with any connecting end of any inductor in the first inductor group, and the second connecting end of the first crossover element is connected with any connecting end of any inductor in the second inductor group.

The device further comprises at least one crossover element, the at least one crossover element being a capacitor or inductor, wherein a first connecting end of each crossover element of the at least one crossover element is connected with any connecting end of any inductor in the first inductor group, and a second connecting end of each crossover element of the at least one crossover element is connected with any connecting end of any inductor in the second inductor group.

The device further comprises a second crossover element, wherein the second crossover element is a capacitor or inductor, and
 a first connecting end of the second crossover element is connected with the first connecting end of the first inductor group, and a second connecting end of the second crossover element is connected with the first connecting end of the second inductor group.

The first phase shift circuit further comprises a third capacitor, and/or the second phase shift circuit further comprises a fourth capacitor, wherein a first connecting end of the third capacitor is connected with the second connecting end of the first inductor group, and a second connecting end of the third capacitor is grounded;

a first connecting end of the fourth capacitor is connected with the second connecting end of the second inductor group, and a second connecting end of the fourth capacitor is grounded.

The device further comprises first radio-frequency (RF) traps and/or second RF traps, wherein the first RF traps are connected between the second connecting end of the first inductor group and the first connecting end of the first crossover element;

the second RF traps are connected between the second connecting end of the second inductor group and the second connecting end of the first crossover element.

The first phase shift circuit comprises a first capacitor and a first inductor, wherein a first connecting end of the first capacitor is connected with the first port of the first coil unit and a first connecting end of the first inductor, a second connecting end of the first capacitor is grounded, and a second connecting end of the first inductor is connected with the first connecting end of the first crossover element;

the second phase shift circuit comprises a second capacitor and a second inductor, wherein a first connecting end of the second capacitor is connected with the first port of the second coil unit and a first connecting end of the second inductor, a second connecting end of the second capacitor is grounded, and a second connecting end of the second inductor is connected with the second connecting end of the first crossover element.

The first phase shift circuit comprises a first capacitor, a third inductor and a fourth inductor, wherein a first connecting end of the first capacitor is connected with the first port of the first coil unit and a first connecting end of the third inductor, a second connecting end of the first capacitor is grounded, and a second connecting end of the third inductor is connected with the first connecting end of the first crossover element and a first connecting end of the fourth inductor;

the second phase shift circuit comprises a second capacitor, a fifth inductor and a sixth inductor, wherein a first connecting end of the second capacitor is connected with the first port of the second coil unit and a first connecting end of the fifth inductor, a second connecting end of the second capacitor is grounded, and a second connecting end of the fifth inductor is connected with the second connecting end of the first crossover element and a first connecting end of the sixth inductor.

The first phase shift circuit comprises a first capacitor, a seventh inductor and an eighth inductor, wherein a first connecting end of the first capacitor is connected with the first port of the first coil unit and a first connecting end of the seventh inductor, a second connecting end of the first capacitor is grounded, and a second connecting end of the seventh inductor is connected with the first connecting end of the first crossover element and a first connecting end of the eighth inductor;

the second phase shift circuit comprises a second capacitor and a ninth inductor, wherein a first connecting end of the second capacitor is connected with the first port of the second coil unit and a first connecting end of the ninth inductor, a second connecting end of the second capacitor is grounded, and a second connecting end of the ninth inductor is connected with the second connecting end of the first crossover element.

The first phase shift circuit comprises a first capacitor, a seventh inductor and an eighth inductor, wherein a first connecting end of the first capacitor is connected with the first port of the first coil unit and a first connecting end of the seventh inductor, a second connecting end of the first capacitor is grounded, and a second connecting end of the seventh inductor is connected with the first connecting end of the first crossover element and a first connecting end of the eighth inductor;

the second phase shift circuit comprises a second capacitor and a ninth inductor, wherein a first connecting end of the second capacitor is connected with the first port of the second coil unit, a first connecting end of the ninth inductor and a second connecting end of the first crossover element, and a second connecting end of the second capacitor is grounded.

An MR system comprises the above-mentioned coil unit decoupling device.

In aspects of the present disclosure, the first coil unit is connected with the first phase shift circuit, the second coil unit is connected with the second phase shift circuit, the first crossover capacitor or inductor is connected between the first phase shift circuit and the second phase shift circuit, and reactance coupling and/or impedance coupling between the first coil unit and the second coil unit is offset by the first crossover capacitor or inductor to realize decoupling between the first coil unit and the second coil unit. Thus, decoupling between the coil units is realized, and the complexity in decoupling the coil units is lowered.

BRIEF DESCRIPTION OF THE DRAWINGS

Preferred aspects of the present disclosure will be described in detail below by referring to the drawings so that those skilled in the art can have a clearer idea of the above-mentioned and other characteristics and advantages of the present disclosure.

DESCRIPTION OF REFERENCE NUMERALS IN THE DRAWINGS

Figure 1:
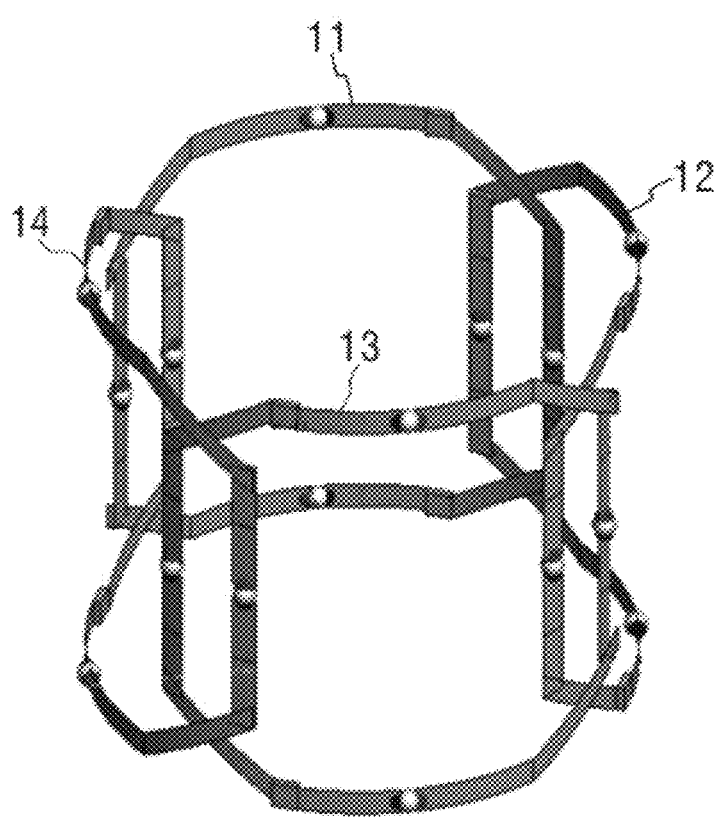
FIG. 1 is a schematic diagram of typical four coil units distributed on a cylindrical surface.

| Reference numeral | Meaning |
|---|---|
| 11-14 | Coil units |
| 20 | Coil unit decoupling device provided by the present disclosure |
| 100 | First coil unit |
| 200 | Second coil unit |
| 21 | First phase shift circuit |
| 22 | Second phase shift circuit |
| 120 | First crossover element |
| 121 | Second crossover element |
| 101 | First port of first coil unit |
| 201 | First port of second coil unit |
| 211 | First capacitor |
| 212 | First inductor |
| 2121 | Third inductor |
| 2122 | Fourth inductor |
| 2123 | Seventh inductor |
| 2124 | Eighth inductor |
| 213 | Third capacitor |
| 214, 215 | First RF trap |
| 221 | Second capacitor |
| 222 | Second inductor |
| 2221 | Fifth inductor |
| 2222 | Sixth inductor |
| 2223 | Ninth inductor |
| 223 | Fourth capacitor |
| 224, 225 | Second RF trap |

DETAILED DESCRIPTION

To make clearer the objectives, technical solutions, and advantages of the present disclosure, aspects are used below to further describe the present disclosure.

Figure 2:
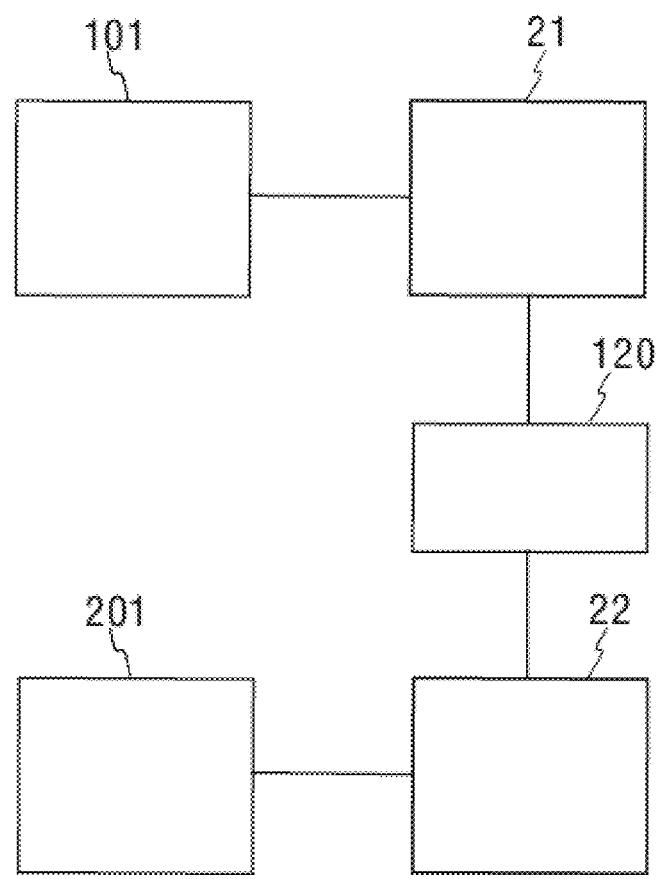
FIG. 2 shows the structure of a coil unit decoupling device provided by one aspect of the present disclosure.

FIG. 2 shows the structure of a coil unit decoupling device 20 provided by one aspect of the present disclosure. The device 20 mainly comprises a first phase shift circuit 21, a second phase shift circuit 22 and a first crossover element 120, and the first crossover element 120 is a capacitor or inductor, wherein a first connecting end of the first phase shift circuit 21 is connected with a first port 101 of a first coil unit;

a second connecting end of the first phase shift circuit 21 is connected with a first connecting end of the first crossover element 120;

a first connecting end of the second phase shift circuit 22 is connected with a first port 201 of a second coil unit;

a second connecting end of the second phase shift circuit 22 is connected with a second connecting end of the first crossover element 120;

wherein, the first phase shift circuit 21 enables the first coil unit to be matched and enables the first coil unit to have a phase shift of 180° between a matched state and a non-matched state; the second phase shift circuit 22 enables the second coil unit to be matched and enables the second coil unit to have a phase shift of 180° between a matched state and a non-matched state, the first coil unit and the second coil unit are located in an MR system, the first port 101 is any port on the self-contained loop of the first coil unit, and the second port 201 is any port on the self-contained loop of the second coil unit.

A plurality of ports for connecting capacitors are available on the self-contained loop of each coil unit in the MR system. Any port on the self-contained loop of the first coil unit can serve as the first port 101, and any port on the self-contained loop of the second coil unit can serve as the second port 201.

In the above-mentioned aspect, the first coil unit is connected with the first phase shift circuit, the second coil unit is connected with the second phase shift circuit, the first crossover capacitor or inductor is connected between the first phase shift circuit and the second phase shift circuit, and reactance coupling and/or impedance coupling between the first coil unit and the second coil unit is offset by the first crossover capacitor or inductor to realize decoupling between the first coil unit and the second coil unit. Thus, decoupling between the coil units is realized, and the complexity in decoupling the coil units is lowered.

The specific implementation of the coil unit decoupling device 20 may be as follows:

The first phase shift circuit 21 comprises a first capacitor 211 and a first inductor 212, wherein a first connecting end of the first capacitor 211 is connected with a first port 101 of a first coil unit 100 and a first connecting end of the first inductor 212, a second connecting end of the first capacitor 211 is grounded, a second connecting end of the first inductor 212 is connected with a first connecting end of a first crossover element 120, and the second connecting end of the first inductor 212 is also connected with a subsequent circuit of the first coil unit 100, for example, the input end of a front-end low-noise amplifier of the first coil unit 100, through a signal line;

and/or, the second phase shift circuit 22 comprises a second capacitor 221 and a second inductor 222, wherein a first connecting end of the second capacitor 221 is connected with the first port 201 of the second coil unit 200 and a first connecting end of the second inductor 222, a second connecting end of the second capacitor 221 is grounded, and a second connecting end of the second inductor 222 is connected with the second connecting end of the first crossover element 120. The second connecting end of the second inductor 222 is also connected with a subsequent circuit of the second coil unit 200, for example, the input end of a front-end low-noise amplifier of the second coil unit 200, through a signal line.

Figure 3:
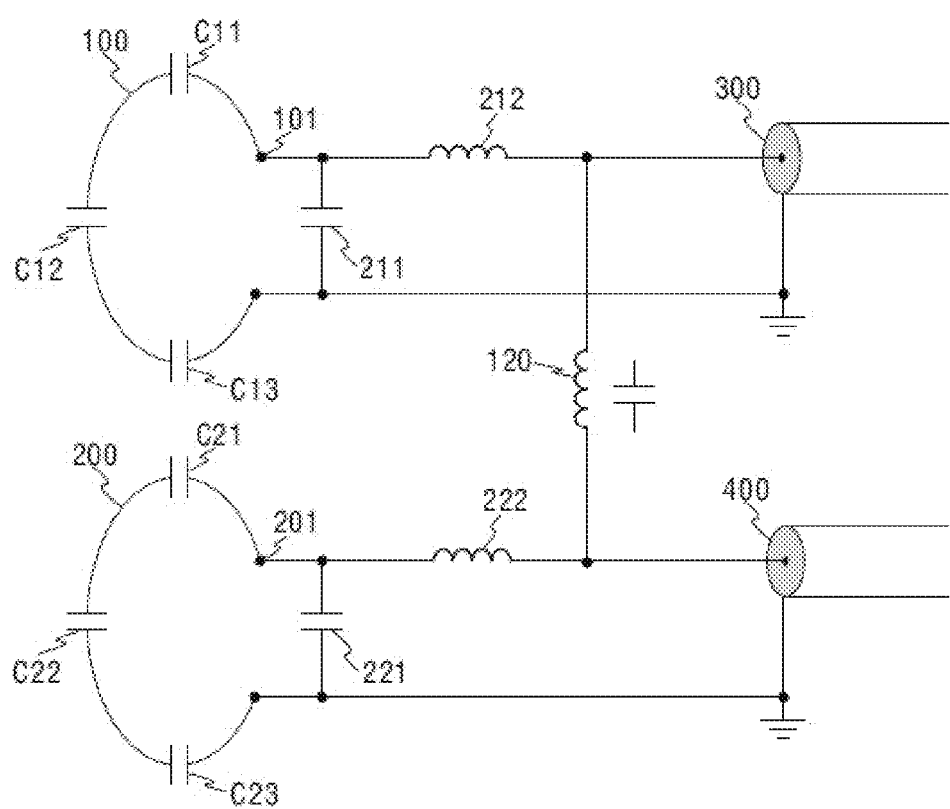
FIG. 3 shows the structure of a coil unit decoupling device provided by another aspect of the present disclosure.

FIG. 3 shows the first phase shift circuit 21 comprising a first capacitor 211 and a first inductor 212, and the second phase shift circuit 22 comprising a second capacitor 221 and a second inductor 222. Wherein, 300 and 400 represent coaxial cables, respectively.

In practical applications, tuning is first required in the production of coils, that is, the frequency of each coil unit is adjusted to the MR frequency. When a coil unit is tuned, it is necessary to first disconnect the loops of all other coil units, and then adjust the capacitances of the capacitors on the loop of the coil unit until the frequency of the coil unit reaches the MR frequency. As shown in FIG. 3, there are only two coil units. When the first coil unit 100 is tuned, it is necessary to disconnect the loop of the second coil unit 200, for example, disconnect one of the capacitors C21, C22 and C23 on the loop of the second coil unit 200, and then adjust the capacitances of the capacitors C11, C12 and C13 on the loop of the first coil unit 100 until the frequency of the first coil unit 100 reaches the MR frequency.

For the device shown in FIG. 3, the values of the first capacitor 211, the first inductor 212, the second capacitor 221, the second inductor 222 and the first crossover element 120 are determined in the following way:

When the first coil unit 100 and the second coil unit 200 are electrified, the values of the first capacitor 211, the first inductor 212, the second capacitor 221, the second inductor 222 and the first crossover element 120 are continuously adjusted, and the phase shift of the first connecting end of the first crossover element 120 between the current state and a non-matched state and the phase shift of the second connecting end of the first crossover element 120 between the current state and a non-matched state are respectively measured for each group of values through simulations. When the two phase shifts are both 180°, the adjustment of the values of the above-mentioned elements is stopped, and it is determined that the first coil unit 100 and the second coil unit 200 are both in a matched state.

After the first coil unit 100 and the second coil unit 200 are both in a matched state, the value of the first crossover element 120 is adjusted (the values of the first capacitor 211, the first inductor 212, the second capacitor 221, and the second inductor 222 may need to be fine-tuned during this process) until optimal decoupling between the first coil unit 100 and the second coil unit 200 is achieved. At this time, the values of the first capacitor 211, the first inductor 212, the second capacitor 221, the second inductor 222 and the first crossover element 120 are the desired values.

The standard impedance of an RF circuit is usually 50 ohms. When the impedances of the first connecting end and second connecting end of the first crossover element 120 reach 50 ohms during adjustments of the values of the first capacitor 211, the first inductor 212, the second capacitor 221, the second inductor 222 and the first crossover element 120, it indicates that the first coil unit 100 and the second coil unit 200 are in a matched state.

Figure 4:
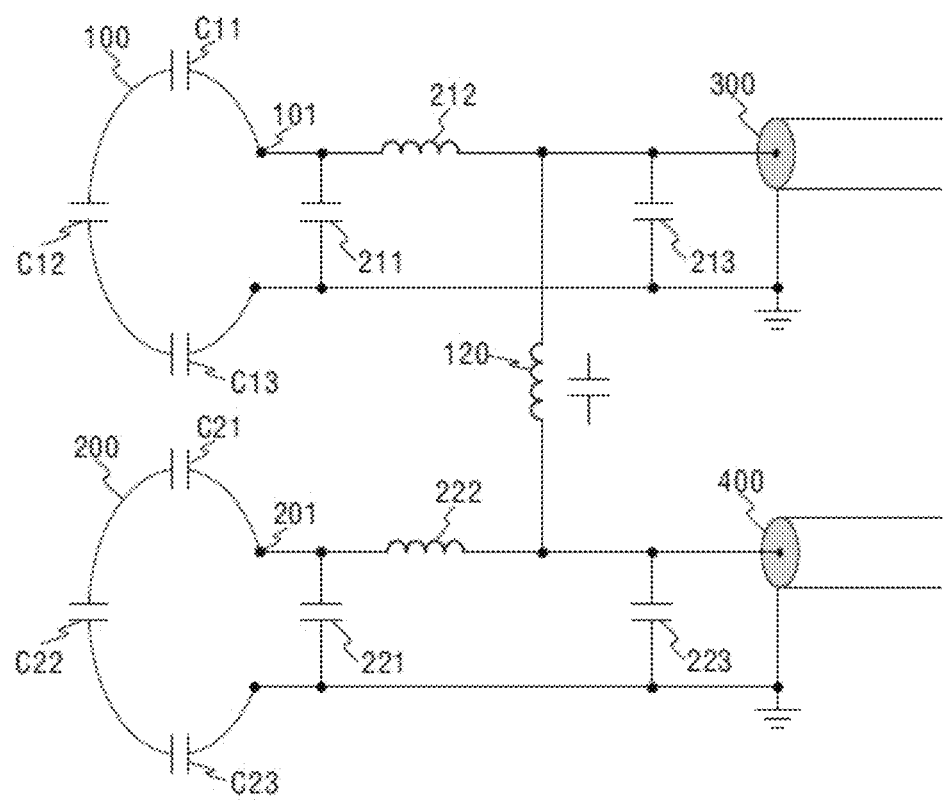
FIG. 4 shows the structure of a coil unit decoupling device provided by a still another aspect of the present disclosure.

In practical applications, when more than two coil units, for example, four coil units as shown in FIG. 1, or even more coil units, for example, eight coil units, are distributed on a cylindrical surface in an MR system, a crossover element (like the first crossover element) needs to be connected between the phase shift circuits of every two coil units and each coil unit needs to be connected with a phase shift circuit (like the first phase shift circuit or the second phase shift circuit shown in FIG. 2 or 3), respectively. In this case, when the values of the capacitors, inductors and crossover elements are determined, coil units are opened first in pairs, then in triples, then in quadruples, and so on, and the values of the capacitors, inductors and crossover elements are continuously adjusted until optimal decoupling between every two coil units is achieved. The larger the number of coil units is, the more difficult it is to make each adjustment satisfy or approximately satisfy the condition: the phase shift of each coil unit between a matched state and a non-matched state is 180°. The following optimization solution is given for this case:

As shown in FIG. 4, the first phase shift circuit 21 further comprises a third capacitor 213, and/or the second phase shift circuit 22 further comprises a fourth capacitor 223, wherein a first connecting end of the third capacitor 213 is connected with the first connecting end of the first crossover element 120, and a second connecting end of the third capacitor 213 is grounded;

a first connecting end of the fourth capacitor 223 is connected with the second connecting end of the first crossover element 120, and a second connecting end of the fourth capacitor 223 is grounded.

Through the device shown in FIG. 4, the values of the third capacitor 213 and/or the fourth capacitor 223 can further be adjusted to optimize the decoupling between the first coil unit 100 and the second coil unit 200.

Figure 5:
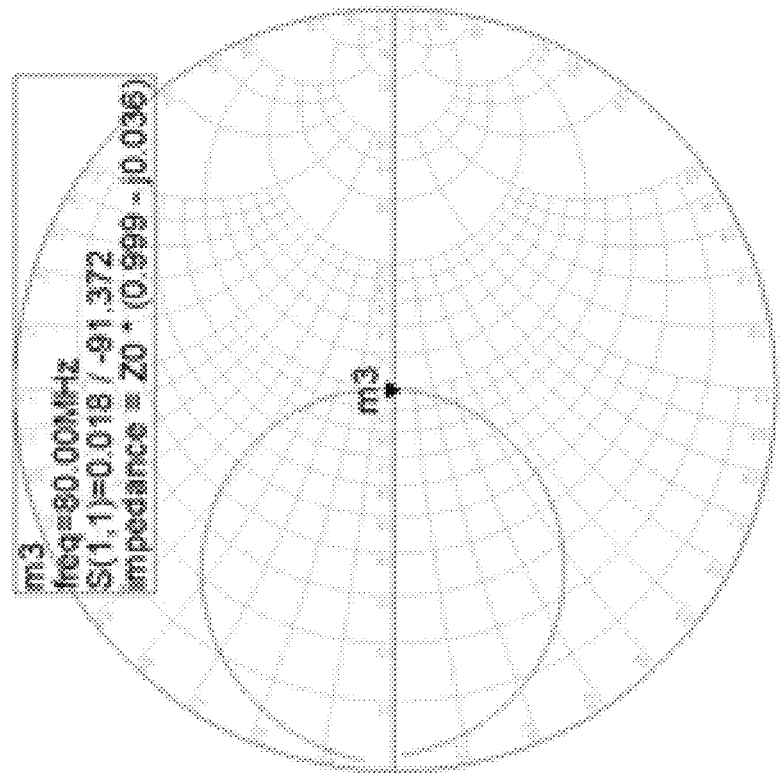
FIG. 5 compares the port matching effects obtained after field simulations are performed for a coil unit in an MR system by use of simulation software, wherein the coil unit decoupling device provided by the present disclosure is applied and is not applied, respectively.
Figure 5:
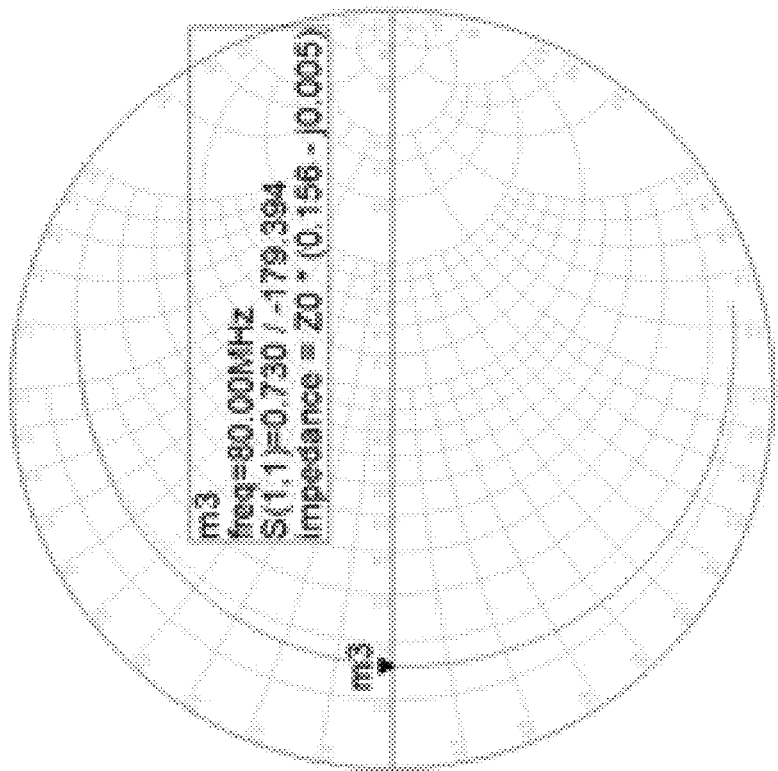

FIG. 5 compares the port matching effects obtained after field simulations are performed for a coil unit in an MR system by use of simulation software, where the coil unit decoupling device provided by the present disclosure is applied and is not applied, respectively. Wherein, m3 represents the reflection parameter of signals on a simulation port (namely, a port connecting a crossover element and a phase shift circuit) on the coil unit, and the reflection parameter is denoted as S(1,1). The left graph shows the simulation when the coil unit decoupling device provided by the present disclosure is not applied, namely, the coil unit is in a non-matched state, and the right graph shows the simulation when the coil unit decoupling device provided by the present disclosure is applied and the coil unit is in a matched state. S(1,1)=0.730/−179.394 in the left graph and S(1,1)=0.018/−91.372 in the right graph, wherein the value before "/" represents an amplitude and the value after "/" represents a phase. The MR frequency in the above-mentioned simulations is 80 MHz. It can be seen from the reflection coefficient of signals on the simulation port that the smaller the amplitude is, the better the matching effect is.

In the aspects of the present disclosure, the first coil unit and the second coil unit may be symmetric with respect to a plane.

In practical applications, decoupling between all coil units can be realized simply by applying the coil unit decoupling device provided by the present disclosure to every two coil units. It can be seen that the complexity is greatly lowered.

Figure 6:
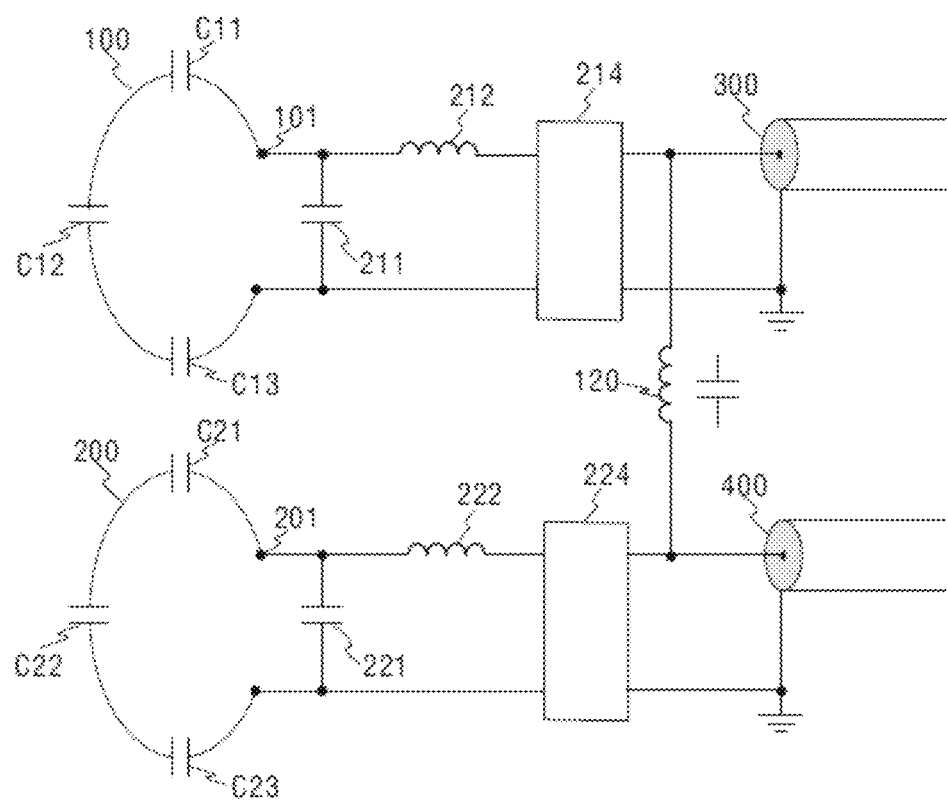
FIG. 6 shows the structure of a coil unit decoupling device provided by one aspect of the present disclosure, wherein an RF trap is added.

In practical applications, the distance between the phase shift circuit connected with each coil unit and the crossover element may be long, and a cable is usually connected between the phase shift circuit and the crossover element in an MR system. When the cable is long, the grounding of the cable may have an antenna effect. To eliminate the antenna effect, an RF trap may be connected between the phase shift circuit and the crossover element. In addition, for some reasons, a coil unit may not be grounded before a front-end amplifier, and in this case, an RF trap also needs to be added before the front-end amplifier. FIG. 6 shows that an RF trap 214 is added between the first inductor 212 and a front-end amplifier in the coil unit decoupling device 20 and an RF trap 224 is added between the second inductor 222 and a front-end amplifier.

Figure 7:
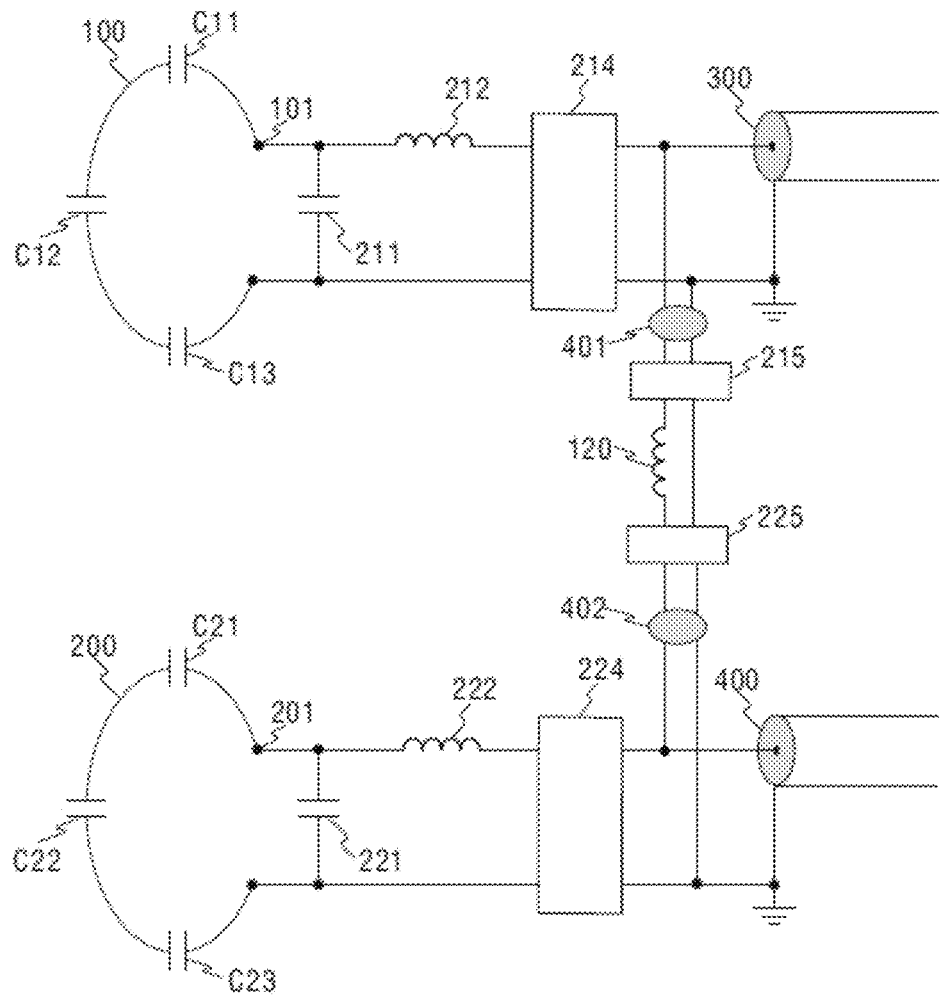
FIG. 7 shows the structure of a coil unit decoupling device provided by another aspect of the present disclosure, wherein an RF trap is added.

In addition, if the distance between coil units is long, an RF trap can also be connected to the cable connecting the first crossover element 120. As shown in FIG. 7, an RF trap 215 is connected between the first crossover element 120 and the first inductor 212, an RF trap 225 is connected between the first crossover element 120 and the second inductor 222, wherein the first inductor 212 and the second inductor 222 may be connected with the crossover element 120 by use of short cables or coaxial cables, and 401 and 402 shown in FIG. 7 are coaxial cables.

Figure 8:
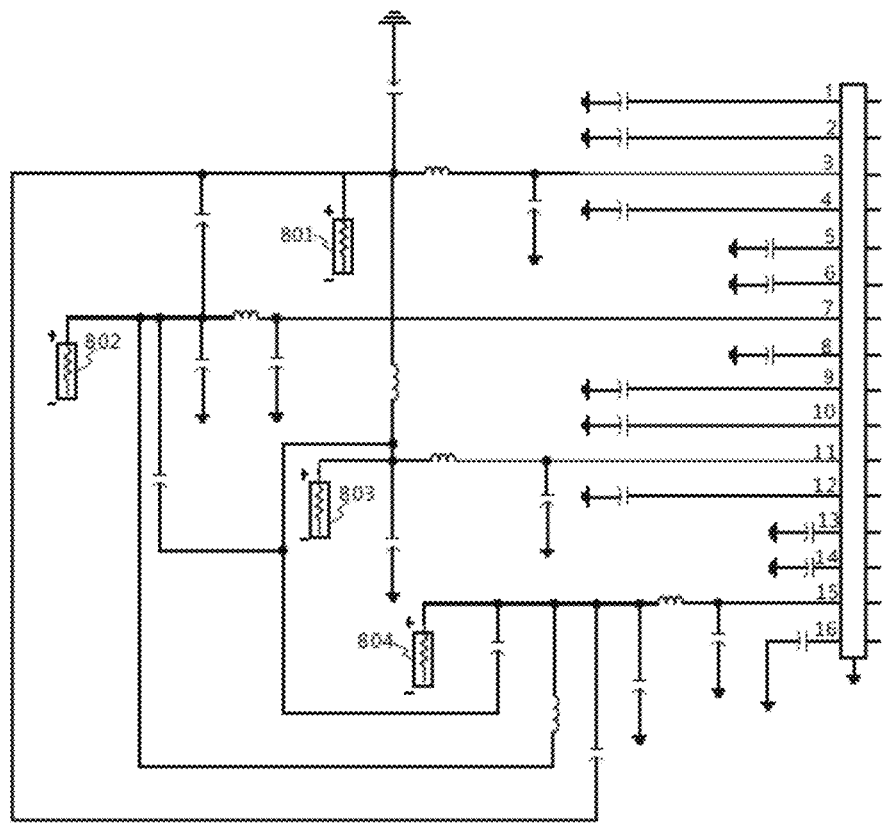
FIG. 8 shows the circuit of the application of the coil unit decoupling device provided by the present disclosure to the coil units shown in FIG. 1.

FIG. 8 shows the circuit of the application of the coil unit decoupling device provided by the present disclosure to the coil units shown in FIG. 1. Wherein, the coil units 11 and 13 are symmetric with respect to a central vertical cross-section of the cylinder, and the coil unit 12 and 14 are symmetric with respect to a central vertical cross-section of the cylinder. The self-contained loop of each coil unit has four ports for connecting capacitors, one port is used for connecting the coil unit decoupling device provided by the present disclosure, and the other three ports are used for connecting capacitors. As shown in FIG. 8, the ports 3, 7, 11 and 15 are used for connecting the decoupling device 20 provided by the present disclosure, and the other three ports on the self-contained loop of each coil unit are used for connecting capacitors. Wherein, a crossover element is respectively connected between the phase shift circuits (namely, between coil units 11 and 12, between coil units 11 and 13, between coil units 11 and 14, between coil units 12 and 13, between coil units 12 and 14 and between coil units 13 and 14) of every two coil units, and the crossover elements shown in FIG. 8 are inductors or capacitors. After the coil unit decoupling device provided by the present disclosure is applied to the coil units 11, 13, 12 and 14, the capacitances of the capacitors on the loops of the coil units 11-14 are adjusted until the frequency of the coil units is the MR frequency (80 MHz in the example). In FIG. 8, the port, connected with a crossover element, on each coil unit is a simulation port, and therefore there are four simulation ports, namely, there are ports 801, 802, 803 and 804 as shown in FIG. 8.

Figure 9:
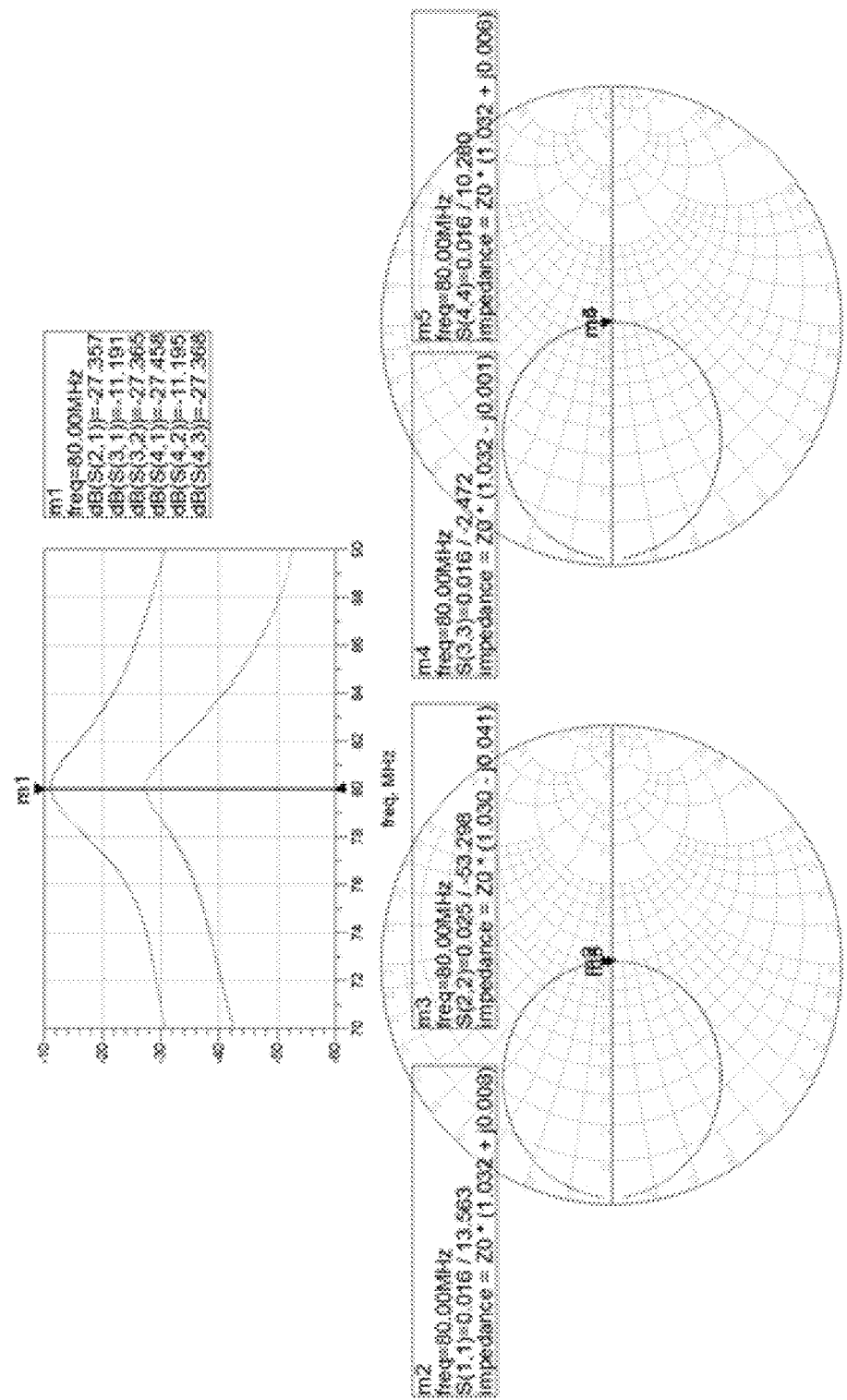
FIG. 9 shows the port matching effect and the decoupling effect obtained after field simulations are performed for the circuit shown in FIG. 8 by use of simulation software.

FIG. 9 shows the port matching effect and the decoupling effect obtained after field simulations are performed for the circuit shown in FIG. 8 by use of simulation software.

Wherein, the port decoupling effect described in terms of dB is shown in the upper graph of FIG. 9. dB(S(A,B)) represents the coupling described in terms of dB between the simulation port A and the simulation port B, and A and B may be any of ports 801-804. For example, dB(S(2,1)) represents the coupling described in terms of dB between the ports 802 and 801.

Wherein, dB(S(2,1))=−27.357, dB(S(3,1))=−11.191, dB(S(3,2))=−27.365, dB(S(4,1))=−27.458, dB(S(4,2))=−11.195, and dB(S(4,3))=−27.368.

It can be seen that the coupling between the ports is all below −10 dB.

The two lower graphs of FIG. 9 show the port matching effects described in terms of amplitudes and phases. S(A,A) represents the reflection coefficient of signals on the simulation port A, described in terms of phases and amplitudes, and A may be any of ports 801-804. For example, S(1,1) represents the reflection coefficient of signals on the port 801, described in terms of phases and amplitudes.

Wherein, S(1,1)=0.016/13.563, S(2,2)=0.025/−53.298, S(3,3)=0.016/−2.472 and S(4,4)=0.016/10.280. Wherein, the value before "/" represents an amplitude and the value after "/" represents a phase.

It can be seen from the reflection coefficient of signals on a port that the smaller the amplitude, the better the matching effect.

Figure 10:
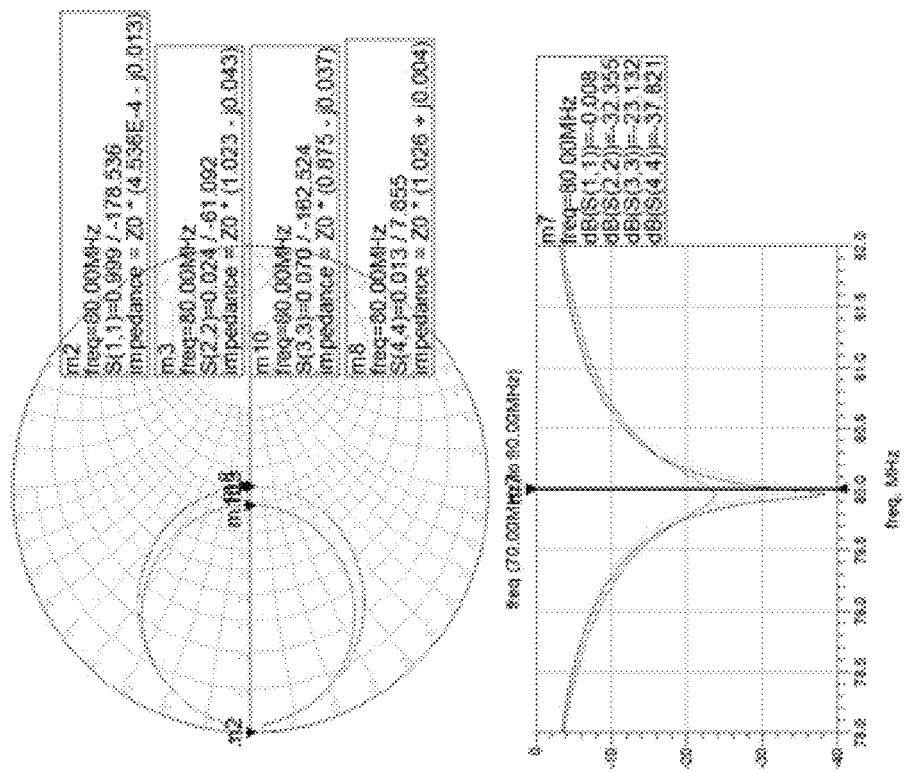
FIG. 10 compares the reflection coefficients of signals on different simulation ports of the circuit in FIG. 8 before and after mistuning of the coil unit 11.
Figure 10:
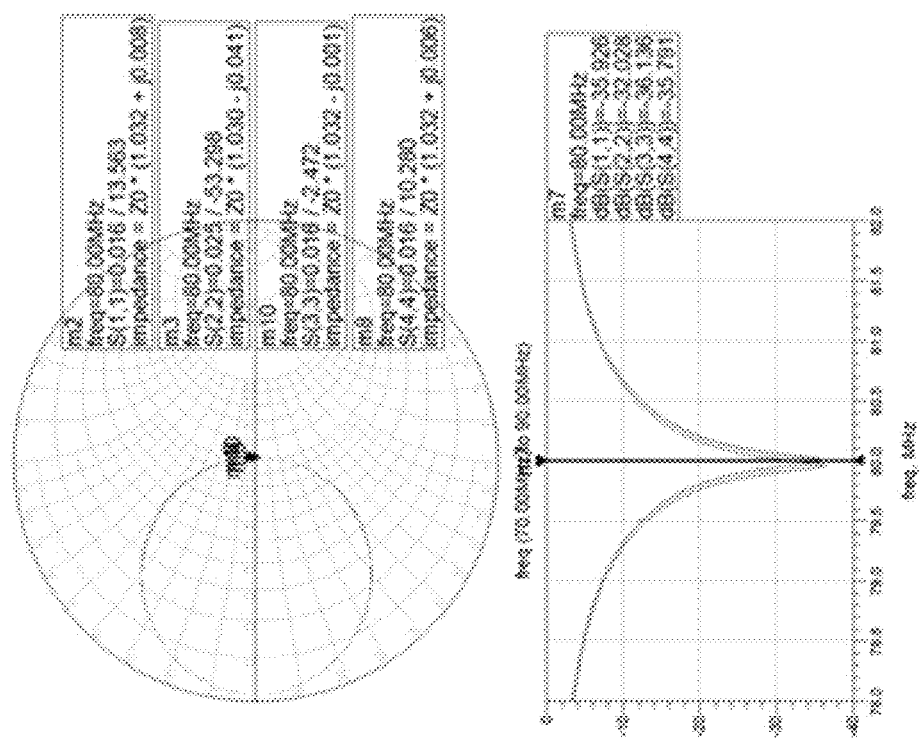

In addition, experiments show that the coil unit decoupling device provided by the present disclosure has another advantage: If a plurality of coil units exist in an MR system and the coil unit decoupling device provided by the present disclosure is applied to the plurality of coil units, decoupling between other coil units is hardly influenced when one coil unit is mistuned. FIG. 10 compares the reflection coefficients of signals on different simulation ports of the circuit shown in FIG. 8 before and after mistuning of the coil unit 11. Wherein, the upper left graph and the lower left graph show the results before mistuning of the coil unit 11, and the upper right graph and the lower right graph show the results after mistuning of the coil unit 11.

Wherein, before mistuning of the coil unit 11: S(1,1)=0.016/13.563, S(2,2)=0.025/−53.298, S(3,3)=0.016/−2.472, S(4,4)=0.016/10.280; dB(S(1,1))=−35.926, dB(S(2,2))=−32.028, dB(S(3,3))=−36.136, dB(S(4,4))=−35.791;

after mistuning of the coil unit 11: dB(S(1,1))=0.008, dB(S(2,2))=−32.355, dB(S(3,3))=−23.132, dB(S(4,4))=−37.821.

It can be seen that the reflection coefficients of signals on the simulation ports of other coil units are still low and the matching effect is still good after the coil unit 11 is mistuned.

This also indicates that after a coil unit or some coil units in an MR system are mistuned, the coil unit decoupling device 20 provided by the present disclosure can still be used to decouple other coil units in the MR system.

Figure 11:
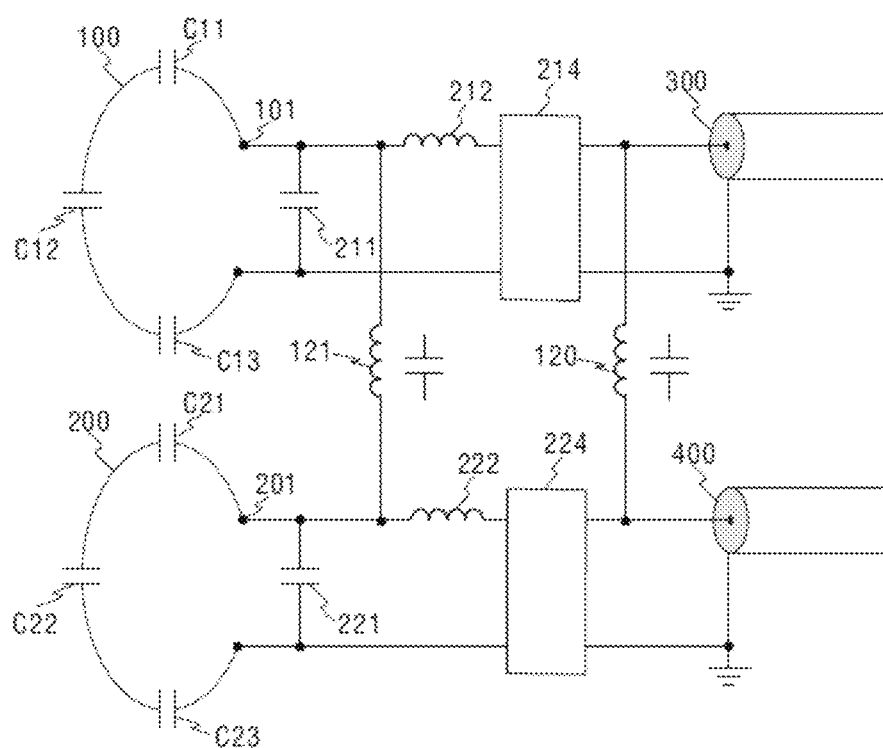
FIG. 11 shows the structure of a coil unit decoupling device provided by yet another aspect of the present disclosure.

For the circuit shown in FIG. 8, although the coupling between each pair of ports is below −10 dB, impedance coupling still exists between the coil units. Thus, the decoupling effect is not ideal, yet. The decoupling effect can be further improved by adding crossover elements (capacitors or inductors). As shown in FIG. 11, a second crossover element 121 is connected between the first connecting end of the first inductor 212 and the first connecting end of the second inductor 222.

Figure 12:
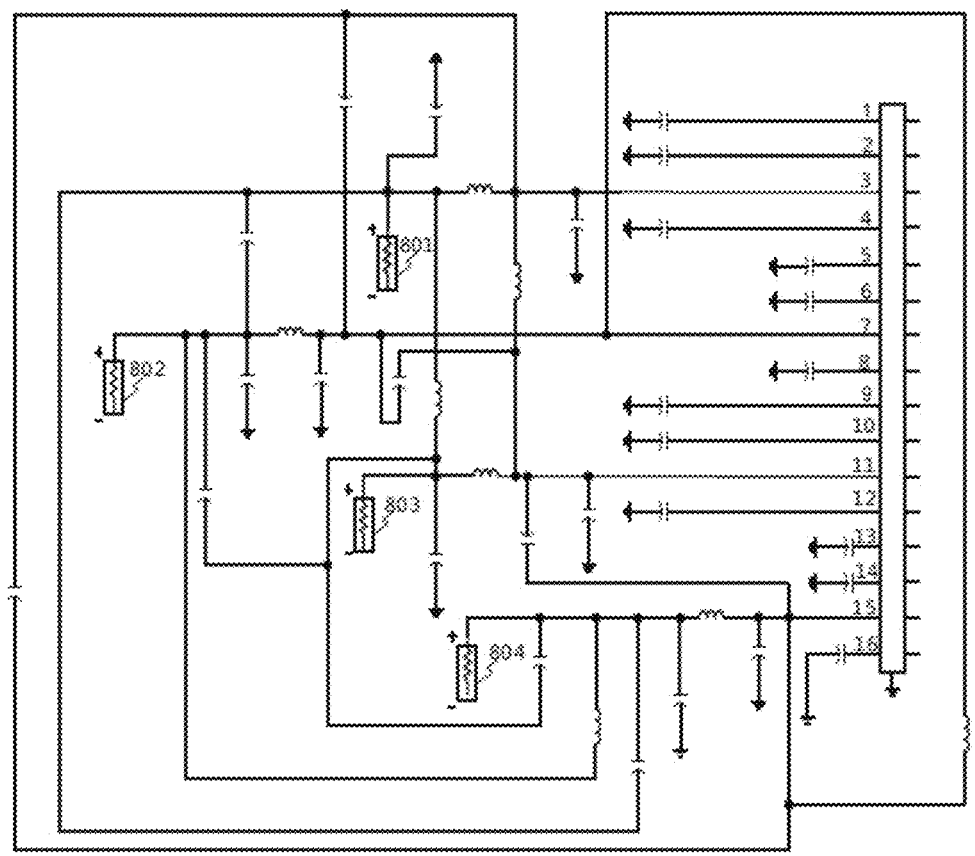
FIG. 12 shows the circuit obtained after a crossover element (capacitor or inductor) is added between the first connecting ends of the inductors in the phase shift circuit of every two coil units on the basis of the circuit shown in FIG. 8.

On the basis of the circuit shown in FIG. 8, a crossover element (capacitor or inductor) is added between first connecting ends of the inductors in the phase shift circuit of every two coil units, and then the circuit shown in FIG. 12 is obtained.

Figure 13:
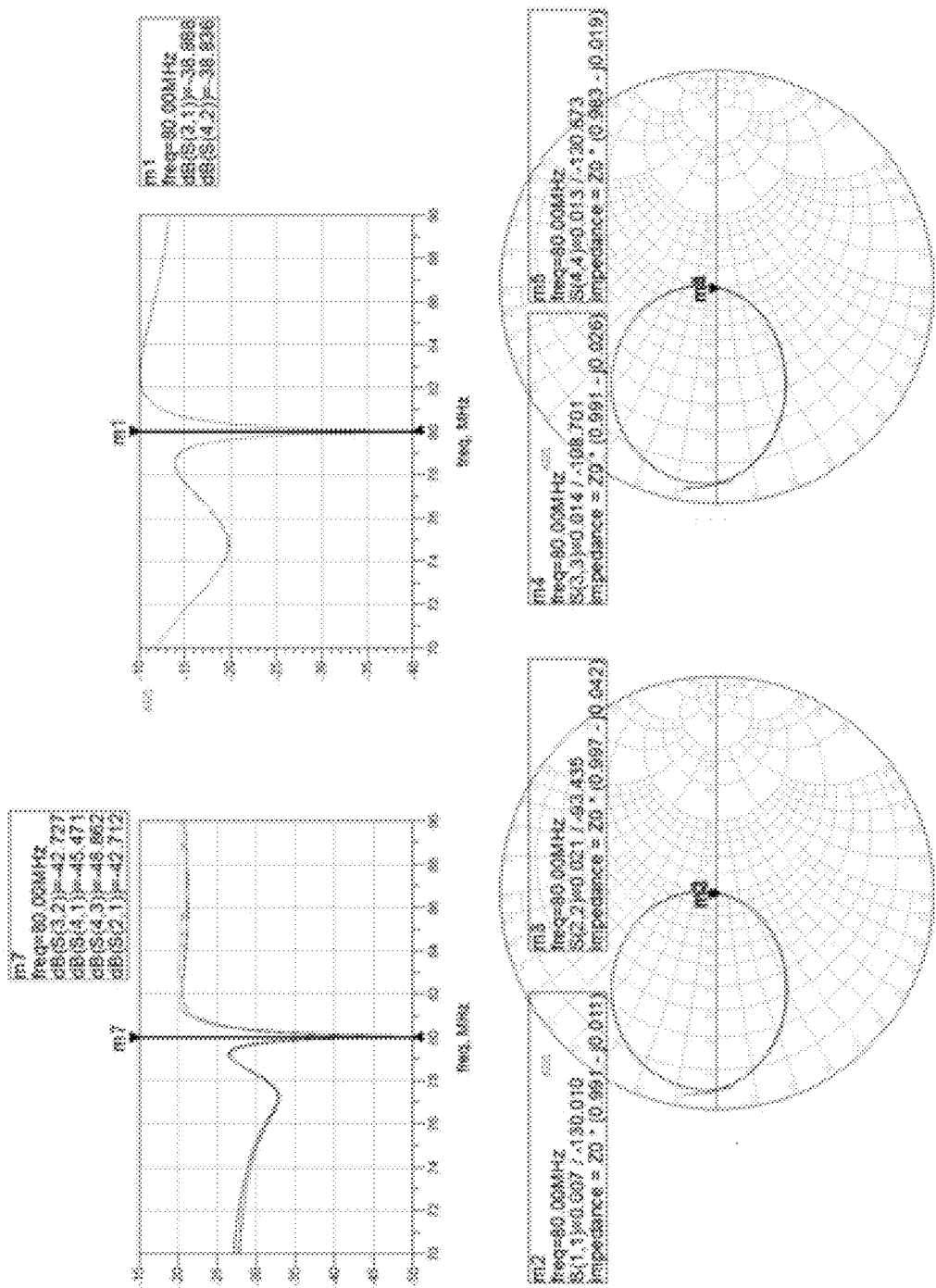
FIG. 13 shows the port matching effect and the decoupling effect obtained after field simulations are performed for the circuit shown in FIG. 12 by use of simulation software.

FIG. 13 shows the port matching effect and the decoupling effect obtained after field simulations are performed for the circuit in shown FIG. 12 by use of simulation software. Wherein, dB(S(3,2))=−42.727, dB(S(4,1))=−45.471, dB(S(4,3))=−48.862, dB(S(2,1))=−42.712, dB(S(3,1))=−38.888, dB(S(4,2))=−38.836;

S(1,1)=0.007/−130.010, S(2,2)=0.021/−93.435, S(3,3)=0.014/−108.701, S(4,4)=0.013/−130.673.

It can be seen that dB(S(3,1)) and dB(S(4,2)) are further optimized to below −30 dB, and that dB(S(3,2)), dB(S(4,1)), dB(S(4,3)) and dB(S(2,1)) are further optimized to below −40 dB provided that each port still remains matched.

In an alternative aspect, the first inductor 212 may be replaced by a first inductor group consisting of a plurality of inductors connected in series, and/or the second inductor 222 may also be replaced by a second inductor group consisting of a plurality of inductors connected in series; in addition, according to the goal of achieving the optimal decoupling effect, for the first crossover element 120, a connecting end may be selected from the connecting ends of the plurality of inductors in the first inductor group to connect the first connecting end of the first crossover element 120, and a connecting end may be selected from the connecting ends of the plurality of inductors in the second inductor group to connect the second connecting end of the first crossover element 120.

Figure 14:
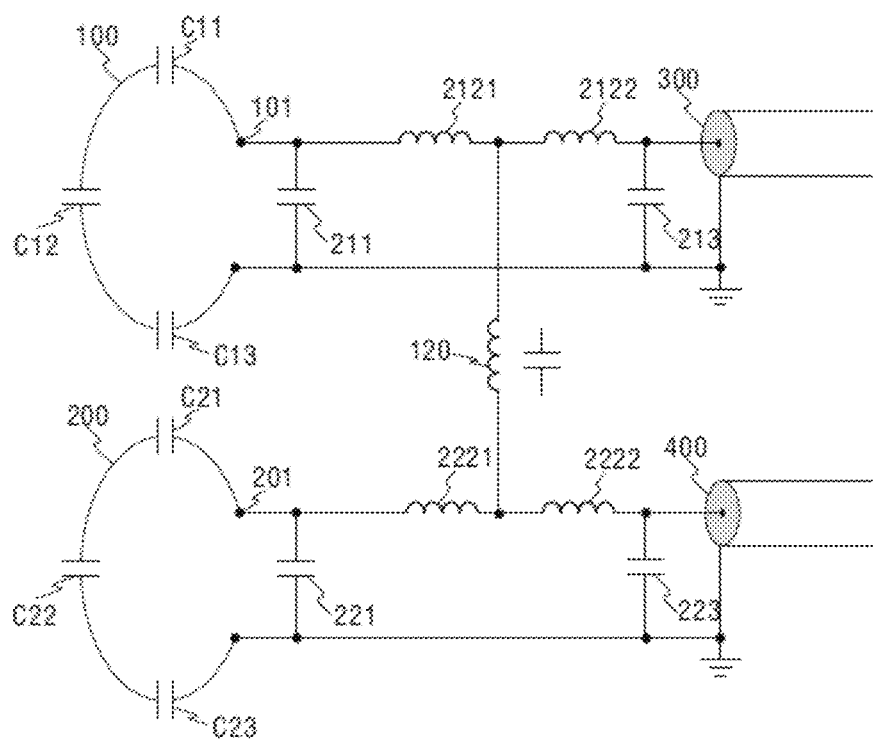
FIG. 14 shows the structure of a coil unit decoupling device provided by another aspect of the present disclosure.

FIG. 14 shows the structure of a coil unit decoupling device wherein the first inductor 212 is replaced by two inductors: inductor 2121 and inductor 2122, and the second inductor 222 is replaced by two inductors: inductor 2221 and inductor 2222, and in FIG. 14, the first connecting end of the first crossover element 120 is connected with a second connecting end of the inductor 2121 and the second connecting end of the first crossover element 120 is connected with a second connecting end of the inductor 2221.

Figure 15:
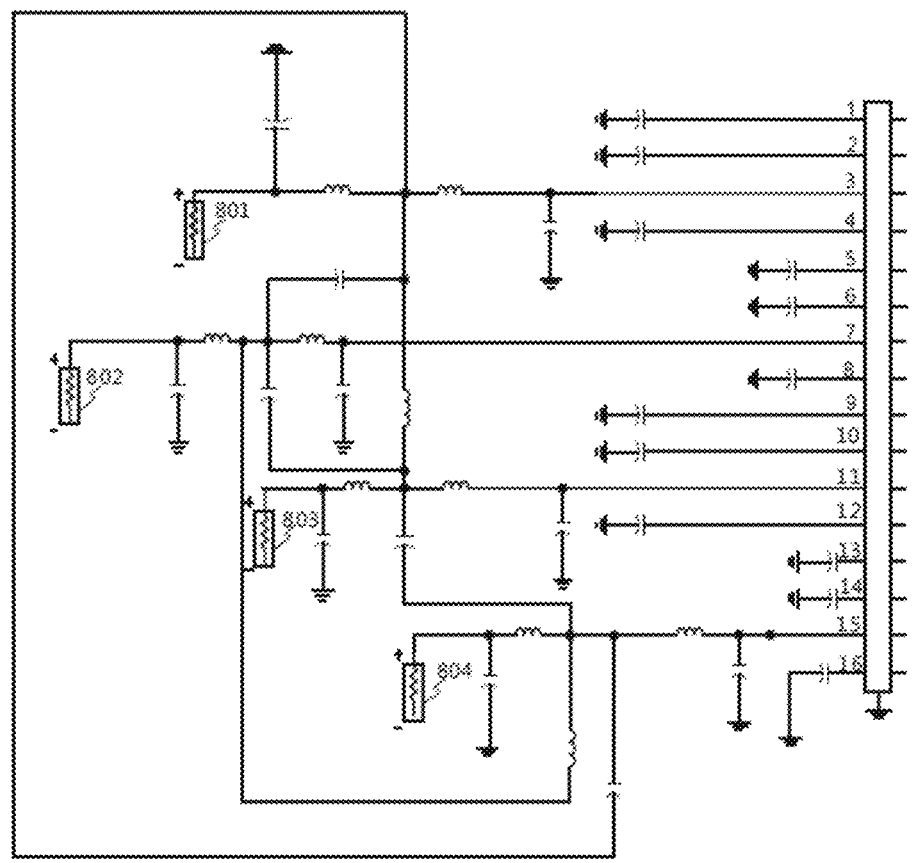
FIG. 15 shows the circuit obtained after the inductor in the phase shift circuit of each coil unit is replaced by two inductors connected in series and the connection point between the phase shift circuit and the crossover element is located on the connection line between the two inductors on the basis of the circuit shown in FIG. 8.

On the basis of the circuit shown in FIG. 8, an inductor on the phase shift circuit of each coil unit is replaced by two inductors connected in series, the connection point between the phase shift circuit and the crossover element is located on the connection line between the two inductors, and then the circuit shown in FIG. 15 is obtained.

Figure 16:
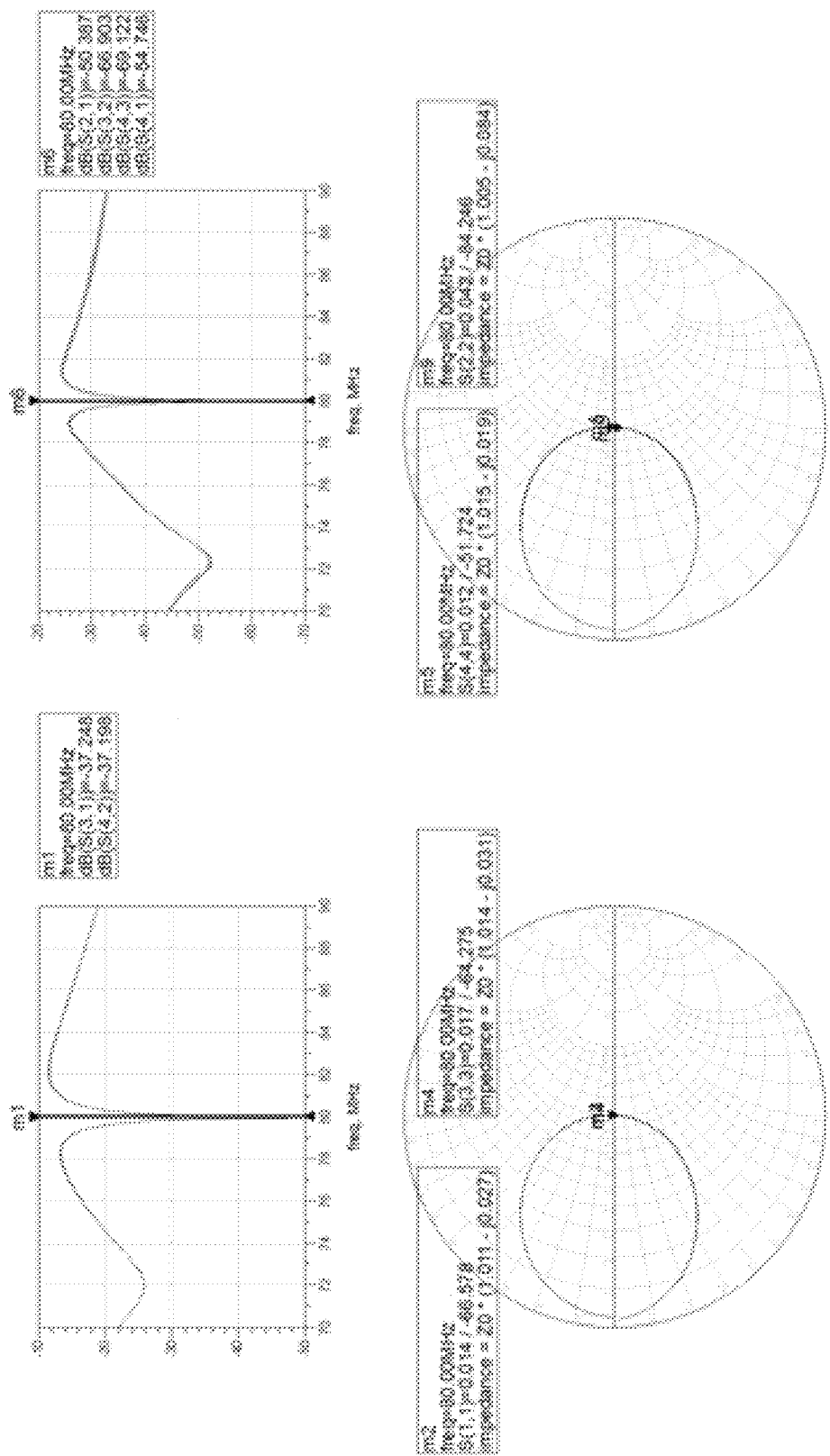
FIG. 16 shows the port matching effect and the decoupling effect obtained after field simulations are performed for the circuit shown in FIG. 15 by use of simulation software.

FIG. 16 shows the port matching effect and the decoupling effect obtained after field simulations are performed for the circuit shown in FIG. 15 by use of simulation software. Wherein, dB(S(3,1))=−37.248, dB(S(4,2))=−37.198, dB(S(2,1))=−50.387, dB(S(3,2))=−66.903, dB(S(4,3))=−69.122, dB(S(4,1))=−54.746;

S(1,1)=0.014/−66.578, S(3,3)=0.017/−64.275, S(4,4)=0.012/−51.724, S(2,2)=0.042/−84.246.

It can be seen that each port has high matching and decoupling performances.

Figure 17:
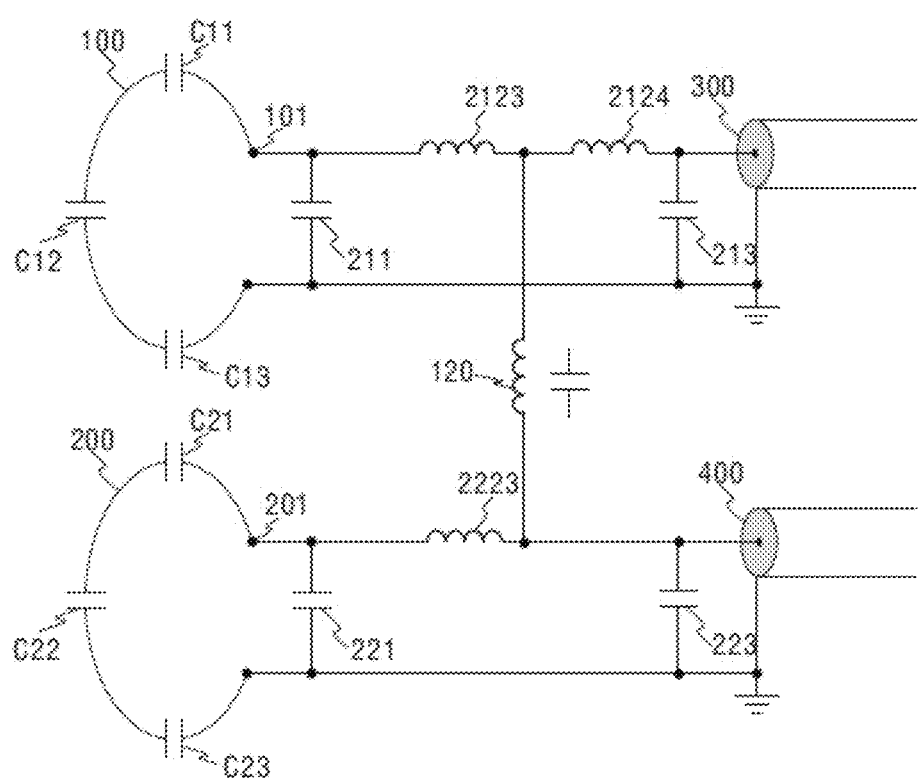
FIG. 17 shows the structure of a coil unit decoupling device provided by yet another aspect of the present disclosure.

FIG. 17 shows another alternative solution. Wherein, the first inductor 212 on the first phase shift circuit 21 is replaced by two inductors: the inductor 2123 and the inductor 2124, and only one inductor 2223 is still adopted on the second phase shift circuit 22. In FIG. 17, the first connecting end of the first crossover element 120 is connected with the second connecting end of the inductor 2121 and the second connecting end of the first crossover element 120 is connected with the second connecting end of the inductor 2223.

Figure 18:
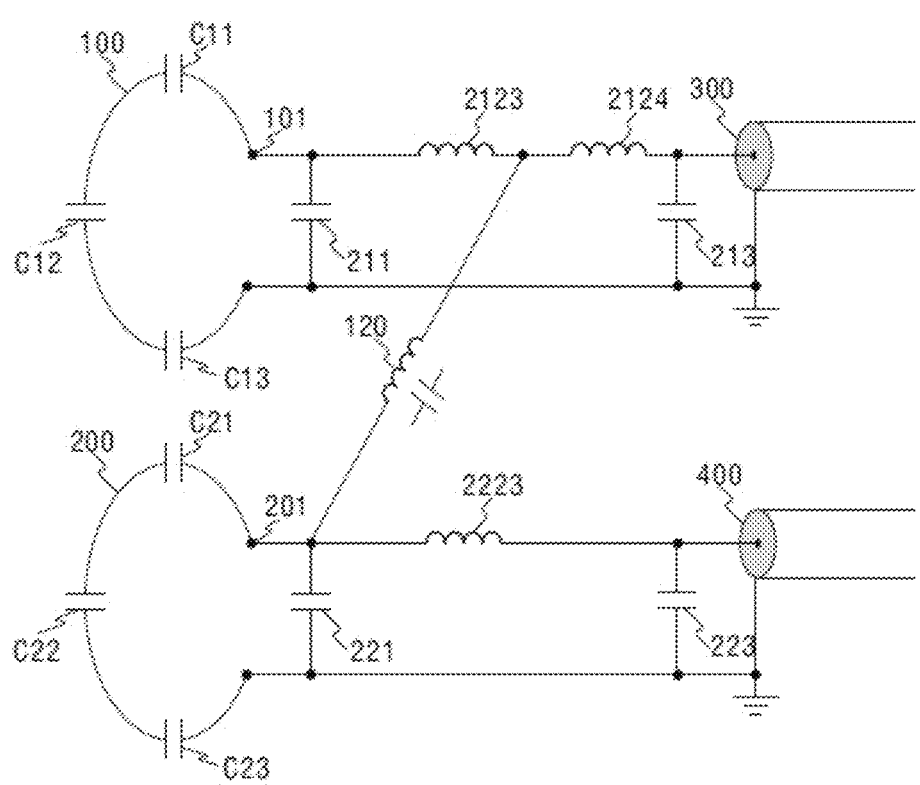
FIG. 18 shows the structure of a coil unit decoupling device provided by still another aspect of the present disclosure.

FIG. 18 shows a still another alternative solution. Like that shown in FIG. 17, the first inductor 212 on the first phase shift circuit 21 is replaced by two inductors: the inductor 2123 and the inductor 2124, and only one inductor 2223 is still adopted on the second phase shift circuit 22. Different from FIG. 17, in FIG. 18, the first connecting end of the first crossover element 120 is connected with the second connecting end of the inductor 2121, and the second connecting end of the first crossover element 120 is connected with the first connecting end of the inductor 2223.

In addition, in an alternative aspect, when the first inductor 212 is replaced by a first inductor group consisting of a plurality of inductors connected in series and the second inductor 222 is replaced by a second inductor group consisting of a plurality of inductors connected in series, a plurality of (for example, more than two) crossover elements can be adopted to achieve an optimal decoupling effect. Wherein, according to the goal of achieving the optimal decoupling effect, the first connecting end of each crossover element can be connected with any connecting end of any inductor in the first inductor group, and the second connecting end of each crossover element can be connected with any connecting end of any inductor in the second inductor group.

Figure 19:
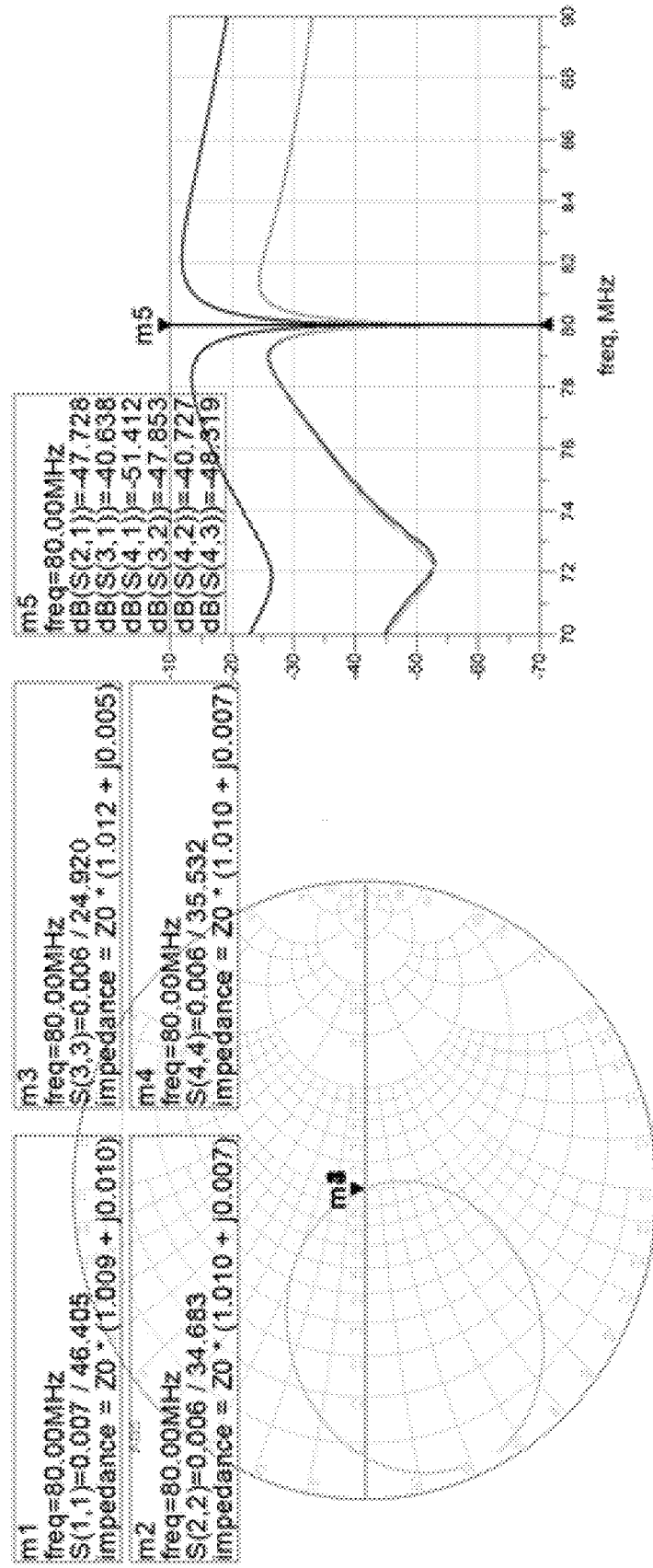
FIG. 19 shows the port matching effect and the decoupling effect obtained after field simulations are performed in the case that the phase of the simulation ports on the circuit shown in FIG. 8 is −45°.

The coil unit decoupling device provided by the present disclosure must be placed before the front-end low-noise amplifier of a coil unit. The phase can be adjusted according to the actual requirements so that the coil unit and the front-end low-noise amplifier behind the coil unit can be decoupled and the coil unit and the amplifier can still work normally. For example, if the noise matching angle of the front-end low-noise amplifier is 45°, the phase of the port (namely, the port connected with the crossover element on the phase shift circuit of the coil unit, or the simulation port shown in FIG. 8) into which the coil unit is looked can be adjusted to −135° by use of the phase shift circuit. FIG. 19 shows the port matching effect and the decoupling effect obtained after field simulations are performed in the case that the phase of the simulation ports on the circuit shown in FIG. 8 is −135°. Wherein, S(1,1)=0.007/46.405, S(2,2)=0.006/34.683, S(4,4)=0.006/24.920, S(2,2)=0.006/35.532;

dB(S(2,1))=−47.728, dB(S(3,1))=−40.638, dB(S(4,1))=−51.412, dB(S(3,2))=−47.853, dB(S(4,2))=−40.727, dB(S(4,3))=−48.319.

After the aspects of the present disclosure are adopted, crossover elements will cause an additional SNR loss. Table 1 lists the SNR losses when the coil unit decoupling device provided by aspects of the present disclosure is applied to the coil units shown in FIG. 1 and one, two or more than three crossover inductors with a Q-factor of 80 are adopted for capacitance coupling, inductance coupling and impedance coupling. It can be seen that the SNR losses are respectively 0.072 dB (1.6%) and 0.081 dB (1.8%) when one crossover inductor is adopted for decoupling, and the SNR losses respectively increase to 0.122 dB (2.85%) and 0.087 dB (2.02%) when two or more crossover inductors are adopted.

TABLE 1

|  | SNR loss when one crossover inductor is adopted for capacitance and inductance decoupling | SNR loss when two crossover inductors are adopted for capacitance, inductance and impedance decoupling | SNR loss when more than three crossover inductors are adopted for capacitance, inductance and impedance decoupling | SNR loss when one crossover element is adopted for capacitance, inductance and impedance decoupling |
|---|---|---|---|---|
| Coil unit 1 | 0.071 | 0.122 | 0.087 | 0.081 |
| Coil unit 2 | 0.072 | 0.122 | 0.086 | 0.081 |
| Coil unit 3 | 0.071 | 0.122 | 0.087 | 0.081 |
| Coil unit 4 | 0.072 | 0.122 | 0.087 | 0.081 |

Aspects of the present disclosure further provide an MR system and the system comprises the above-mentioned coil unit decoupling device 20.

The advantageous technical effects of aspects of the present disclosure are as follows:

1. The coil unit decoupling device provided aspects of the present disclosure is structurally simple, is easy to implement and has a strong decoupling effect. Coil units can systematically be adjusted, without any difficulty.
2. No complex copper structure is required and the SRN at the center of coil structure can remain an optimal value.
3. The coil unit decoupling device provided aspects of the present disclosure is especially applicable to a low-field system where the Q-factor is high and it is difficult to realize decoupling.
4. The coil unit decoupling device provided aspects of the present disclosure can still achieve a good decoupling effect when one or more coil units are mistuned.

The above-mentioned aspects are only preferred aspects of the present disclosure and are not intended to restrict the present disclosure. Modifications, equivalent replacements, and improvements made without departing the spirit and principle of the present disclosure should all fall within the scope of protection of the present disclosure.

The invention claimed is:

1. A coil unit decoupling device comprising a first phase shift circuit, a second phase shift circuit, and a first crossover element that is a capacitor or an inductor, wherein:
   a first connecting end of the first phase shift circuit is connected with a first port of a first coil unit,
   a second connecting end of the first phase shift circuit is connected with a first connecting end of the first crossover element,
   a first connecting end of the second phase shift circuit is connected with a first port of a second coil unit,
   a second connecting end of the second phase shift circuit is connected with a second connecting end of the first crossover element, and
   the first phase shift circuit enables the first coil unit to be matched and enables the first coil unit to have a phase shift of 180° between a matched state and a non-matched state, the second phase shift circuit enables the second coil unit to be matched and enables the second coil unit to have a phase shift of 180° between a matched state and a non-matched state, the first coil unit and the second coil unit are located in a magnetic resonance system, the first port of the first coil unit is any port on a self-contained loop of the first coil unit, and the first port of the second coil unit is any port on a self-contained loop of the second coil unit.

2. The device as claimed in claim 1, wherein:
   the first phase shift circuit comprises a first capacitor and a first inductor group, and the first inductor group comprises one or more inductors connected in series,
   a first connecting end of the first capacitor is connected with the first port of the first coil unit and a first connecting end of the first inductor group, and a second connecting end of the first capacitor is grounded, wherein the first connecting end of the first inductor group is the connecting end of a first inductor in the first inductor group for an external connection, and a second connecting end of the first inductor group is the connecting end of a last inductor in the first inductor group for an external connection, and/or
   the second phase shift circuit comprises a second capacitor and a second inductor group,
   a first connecting end of the second capacitor is connected with the first port of the second coil unit and a first connecting end of the second inductor group, and a second connecting end of the second capacitor is grounded, wherein the first connecting end of the second inductor group is the connecting end of a first inductor in the second inductor group for an external connection, and a second connecting end of the second inductor group is the connecting end of a last inductor in the second inductor group for an external connection, and
   the first connecting end of the first crossover element is connected with any connecting end of any inductor in the first inductor group, and the second connecting end of the first crossover element is connected with any connecting end of any inductor in the second inductor group.

3. The device as claimed in claim 2, wherein:
   the device further comprises at least one crossover element, which comprises the first crossover element and is a capacitor or an inductor, and
   a first connecting end of each crossover element of the at least one crossover element is connected with any connecting end of any inductor in the first inductor group, and a second connecting end of each crossover element of the at least one crossover element is connected with any connecting end of any inductor in the second inductor group.

4. The device as claimed in claim 2, wherein the device further comprises:
   a second crossover element,
   wherein the second crossover element is a capacitor or inductor, and a first connecting end of the second crossover element is connected with the first connecting end of the first inductor group, and a second connecting end of the second crossover element is connected with the first connecting end of the second inductor group.

5. The device as claimed in claim 2, wherein:
the first phase shift circuit further comprises a third capacitor, and/or that the second phase shift circuit further comprises a fourth capacitor,
a first connecting end of the third capacitor is connected with the second connecting end of the first inductor group and a second connecting end of the third capacitor is grounded, and
a first connecting end of the fourth capacitor is connected with the second connecting end of the second inductor group and a second connecting end of the fourth capacitor is grounded.

6. The device as claimed in claim 2, wherein:
the device further comprises first radio-frequency (RF) traps and/or second RF traps,
the first RF traps are connected between the second connecting end of the first inductor group and the first connecting end of the first crossover element, and
the second RF traps are connected between the second connecting end of the second inductor group and the second connecting end of the first crossover element.

7. The device as claimed in claim 1, wherein:
the first phase shift circuit comprises a first capacitor and a first inductor,
a first connecting end of the first capacitor is connected with the first port of the first coil unit and a first connecting end of the first inductor, a second connecting end of the first capacitor is grounded, and a second connecting end of the first inductor is connected with the first connecting end of the first crossover element,
the second phase shift circuit comprises a second capacitor and a second inductor, and
a first connecting end of the second capacitor is connected with the first port of the second coil unit and a first connecting end of the second inductor, a second connecting end of the second capacitor is grounded, and a second connecting end of the second inductor is connected with the second connecting end of the first crossover element.

8. The device as claimed in claim 1, wherein:
the first phase shift circuit comprises a first capacitor, a third inductor and a fourth inductor,
a first connecting end of the first capacitor is connected with the first port of the first coil unit and a first connecting end of the third inductor, a second connecting end of the first capacitor is grounded, and a second connecting end of the third inductor is connected with the first connecting end of the first crossover element and a first connecting end of the fourth inductor,
the second phase shift circuit comprises a second capacitor, a fifth inductor and a sixth inductor, and
a first connecting end of the second capacitor is connected with the first port of the second coil unit and a first connecting end of the fifth inductor, a second connecting end of the second capacitor is grounded, and a second connecting end of the fifth inductor is connected with the second connecting end of the first crossover element and a first connecting end of the sixth inductor.

9. The device as claimed in claim 1, wherein:
the first phase shift circuit comprises a first capacitor, a seventh inductor and an eighth inductor,
a first connecting end of the first capacitor is connected with the first port of the first coil unit and a first connecting end of the seventh inductor, a second connecting end of the first capacitor is grounded, and a second connecting end of the seventh inductor is connected with the first connecting end of the first crossover element and a first connecting end of the eighth inductor,
the second phase shift circuit comprises a second capacitor and a ninth inductor, and
a first connecting end of the second capacitor is connected with the first port of the second coil unit and a first connecting end of the ninth inductor, a second connecting end of the second capacitor is grounded, and a second connecting end of the ninth inductor is connected with the second connecting end of the first crossover element.

10. The device as claimed in claim 1, wherein:
the first phase shift circuit comprises a first capacitor, a seventh inductor and an eighth inductor,
a first connecting end of the first capacitor is connected with the first port of the first coil unit and a first connecting end of the seventh inductor, a second connecting end of the first capacitor is grounded, and a second connecting end of the seventh inductor is connected with the first connecting end of the first crossover element and a first connecting end of the eighth inductor;
the second phase shift circuit comprises a second capacitor and a ninth inductor, and
a first connecting end of the second capacitor is connected with the first port of the second coil unit, a first connecting end of the ninth inductor and a second connecting end of the first crossover element, and a second connecting end of the second capacitor is grounded.

11. A magnetic resonance system, wherein the magnetic resonance system comprises the coil unit decoupling device as claimed in claim 1.

* * * * *